United States Patent [19]
Hirano et al.

[11] Patent Number: 5,418,418
[45] Date of Patent: May 23, 1995

[54] MICRO-ACTUATOR

[75] Inventors: Toshiki Hirano, Tokyo; Tomotake Furuhata, Yokohama, both of Japan

[73] Assignee: International Business Machines Corporation, Armonk, N.Y.

[21] Appl. No.: 191,679

[22] Filed: Feb. 4, 1994

[30] Foreign Application Priority Data

Feb. 18, 1993 [JP] Japan .................. 5-028750

[51] Int. Cl.⁶ .................................. H01L 41/08
[52] U.S. Cl. .................................. 310/328; 310/317
[58] Field of Search ............... 310/323, 328, 330–330, 310/316, 317, 365, 366

[56] References Cited

U.S. PATENT DOCUMENTS

| | | | |
|---|---|---|---|
| 4,195,243 | 3/1980 | Thaxter | 310/317 |
| 4,785,177 | 11/1988 | Besocke | 310/328 X |
| 5,043,621 | 8/1991 | Culp | 310/316 |
| 5,262,696 | 11/1993 | Culp | 310/328 |
| 5,268,611 | 12/1993 | Culp | 310/328 |
| 5,283,497 | 2/1994 | Culp | 310/328 |

FOREIGN PATENT DOCUMENTS

| | | | |
|---|---|---|---|
| 63-220773 | 9/1988 | Japan . | |
| 0277477 | 11/1988 | Japan | 310/323 |
| 0126178 | 5/1989 | Japan | 310/323 |
| 0026282 | 1/1990 | Japan | 310/323 |
| 0055585 | 2/1990 | Japan | 310/323 |

OTHER PUBLICATIONS

T. Furuhata et al., "Array-Driven Ultrasonic Microactuators", 1991 International Conference on Solid State Sensors and Actuators, Digest of Technical Papers (CAT. No. 91CH2817-5), pp. 1056–1059.

*Primary Examiner*—Mark O. Budd
*Attorney, Agent, or Firm*—Ingrid M. Foerster

[57] ABSTRACT

A micro-actuator suitable for a piezoelectric film is described. A slow deformation and a rapid deformation are repeatedly produced in a piezoelectric film by generating a first voltage pattern V1 having an essentially sawtooth waveform between a pair of electrodes on one side of a wall-like member and a second voltage pattern V2 having an opposite polarity to that of the first voltage pattern V1 between a pair of electrodes on the other side of the wall-like member. As a result, the wall-like member responds by moving slowly in a first direction and rapidly in a second direction. An object placed on the wall-like member is moved in the first direction, because the object can follow the slow movement of the wall-like member but cannot follow its rapid movement.

22 Claims, 7 Drawing Sheets

TRANSLATION

FIG. 9

POSITIONING

FIG. 10

ROTATION

MICRO-ACTUATOR

FIELD OF THE INVENTION

The present invention relates to a micro-actuator that can be manufactured by using micro-fabrication technology, and to a micro-machine comprising an array of such micro-actuators.

BACKGROUND OF THE INVENTION

In recent years, micro-electro-mechanical systems (MEMSs) have been attracting much attention. These are intelligent systems, of sizes ranging from several microns to several hundreds of microns, and consisting of a plurality of components such as sensors, actuators, and electronic circuits fabricated as single units by means of IC manufacturing technology. However, the study of micro-actuators is still at an initial stage. Among various types of micro-actuators, ultrasonic motors using a piezoelectric material such as PZT are currently a subject of particular interest.

As described in Published Unexamined Patent Application (PUPA) No. 63-220773, in conventional ultrasonic motors, a progressive wave is generated in an elastic material by causing two piezoelectric ceramics that are attached to the elastic material to expand and contract repeatedly. This is achieved by applying voltages of different phases to the piezoelectric ceramics. An object placed on the elastic material moves in a direction opposite to that of the progressive wave.

However, these conventional ultrasonic motors have several problems. First, since surface waves are generated over the entire motor area, it is difficult to control position locally. That is, when two objects are placed on an actuator, it is difficult to control the respective positions of the two objects individually. Furthermore, since the position of an object can be obtained only as an integral of its velocity, fine positioning cannot be attained without using a closed-loop control system.

T. Furuhata, T. Hirano, and H. Fujita, in "Array-Driven Ultrasonic Micro-actuators," International Conference Solid-state Sensors and Actuators, 1991, pp. 1056–1059, disclose a micro-positioning device comprising a substrate, a plurality of micro-actuators arranged on the substrate in an array, and a moving member placed on the micro-actuators. Fine positioning is done in a predetermined direction such that the moving member is friction-driven by the rotational motion of the ends of the micro-actuators. Each micro-actuator consists of a driving section for applying a driving force so as to generate vertical motion causing displacement and a mechanism for converting the vertical motion into rotational motion causing displacement in the horizontal direction. This micro-positioning device can solve the problems of the conventional ultrasonic motors mentioned above.

However, the device described in the above paper, in which the moving member is moved horizontally by first generating vertical motion and then converting it into rotational motion, needs some improvements with respect to the speed of the moving member.

Furthermore, when the driving force is generated by using piezoelectric materials in the above device, the piezoelectric materials need to be displaced in the vertical direction. In MEMS, to save space and facilitate integration with electronic circuits, it is desirable that a single-layer piezoelectric film be used, rather than the conventional multi-layer piezoelectric film. However, it is difficult for a single-layer piezoelectric film to provide a large vertical displacement. Therefore, a driving technique suitable for a single-layer piezoelectric film is now required.

SUMMARY OF THE INVENTION

An object of the present invention is to provide a micro-actuator and a micro-machine that can solve, by a novel technique, the foregoing problems associated with the conventional ultrasonic motors represented by the device described in PUPA No. 63-220773.

Another object of the invention is to provide a micro-actuator and a micro-machine suitable for a single-layer piezoelectric film.

According to the present invention, a micro-actuator comprises a piezoelectric film, a wall-like member formed on one surface of the piezoelectric film, and first and second electrode pairs, one pair located on each side of the wall-like member so as to sandwich the piezoelectric film. A slow deformation and a rapid deformation are repeatedly produced in the piezoelectric film by generating oppositely poled voltage patterns in the first and second electrode pairs. A first voltage pattern having an essentially sawtooth waveform is generated between the first pair of electrodes disposed on one side of the wall-like member. A second sawtooth voltage pattern of opposite polarity to the first voltage pattern is generated between the second pair of electrodes, which are disposed on the other side of the wall-like member. As a result, the wall-like member performs a reciprocating motion, so as to move slowly in a first direction, and rapidly in a second direction. An object placed on the wall-like member is moved in the first direction, utilizing the fact that the object can follow the slow movement of the wall-like member but cannot follow its rapid movement. By arranging such wall-like members in an array and controlling their slow and rapid movements, the object can be translated, positioned, and rotated.

DETAILED DESCRIPTION OF THE PREFERRED EMBODIMENT

Figure 1:
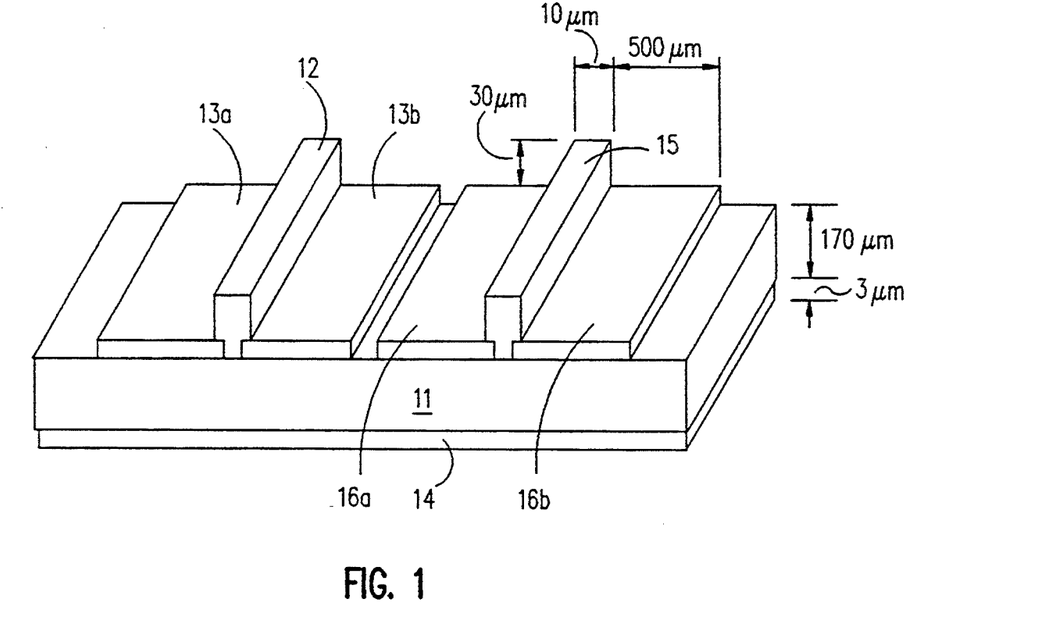
FIG. 1 is a perspective view showing an example of the structure of a micro-actuator according to the present invention.

An example of the structure of the micro-actuator is described with reference to FIG. 1, which shows two micro-actuators. In FIG. 1, wall-like members 12,15 are formed on one surface of a PZT film 11. Aluminum films 13a, 13b and 15a, 15b are formed on the same surface so as to sandwich the wall-like members 12,15. An aluminum film 14 is formed on the back surface of the PZT film over a wide area. Therefore, a pair of electrodes (13a, 14) and another pair of electrodes (13b, 14) are located on the respective sides of the wall-like member 12. Similarly, electrode pairs (15a, 14) and (15b, 14) sandwich wall-like member 15. Examples of the dimensions of the PZT film 11, wall-like members 12,15 and aluminum films 13a, 13b, 16a and 16b are indicated in FIG. 1.

A method of manufacturing the micro-actuator is described below with reference to FIG. 2.

Figure 2A:
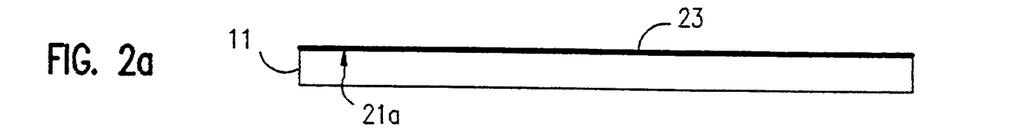
FIGS. 2(a) through 2(f) are sectional views showing the steps followed in manufacturing the micro-actuator of FIG. 1.

In FIG. 2(a), an aluminum film 23 is deposited on a surface 21a of a PZT film 11, for example, by vacuum evaporation or sputtering.

Figure 2B:
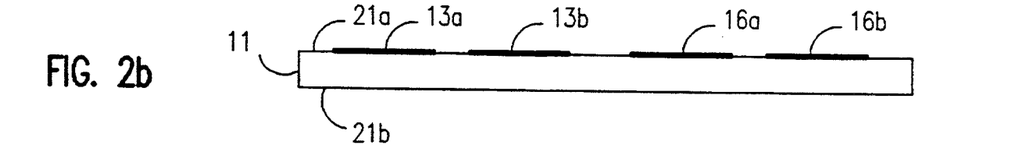

Electrodes 13a, 13b, 16a and 16b are shaped by using a conventional lithography technique or other appropriate methods to form a desired pattern for the aluminum film 23, as shown in FIG. 2(b).

Figure 2C:
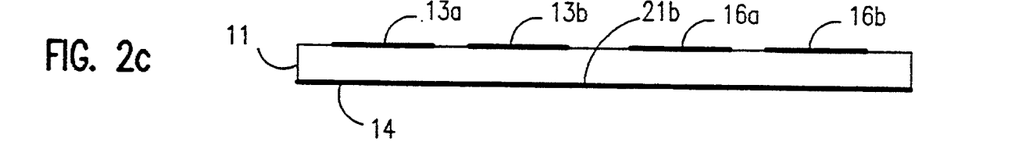

In FIG. 2(c), an aluminum film 14 is deposited over substantially the entire back surface 21b of the PZT film 11.

Figure 2D:
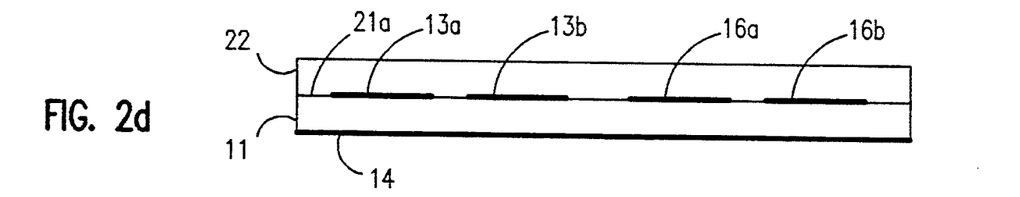
Figure 2E:
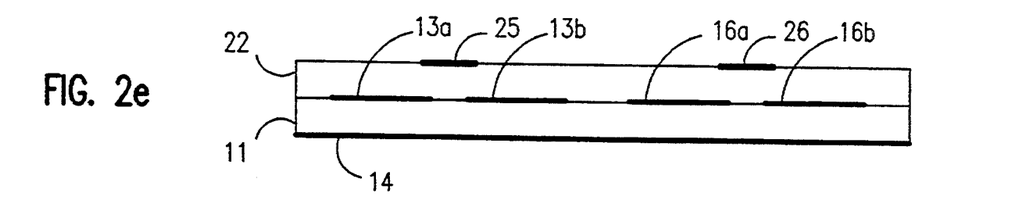

The surface 21a is then covered with a polyimide film 22, as shown in FIG. 2(d).

In a next step, the polyimide film 22 is covered with a nickel film which is patterned to form residual portions 25,26 by conventional methods such as photolithography. (See FIG. 2(e)).

Figure 2F:
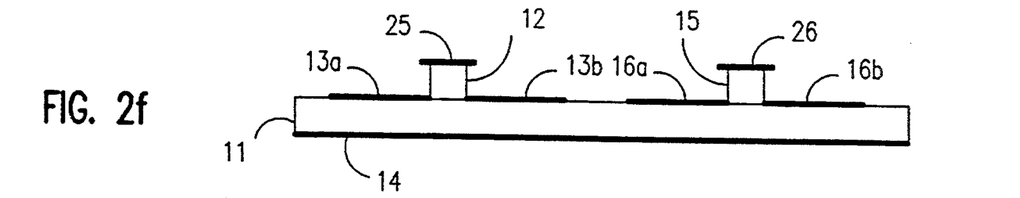

Using the residual portions 25,26 of the nickel film as a mask, the polyimide film 22 is etched by reactive ion etching or other conventional methods to form wall-like members, as shown in FIG. 2(f). The residual portions 25,26 of the nickel film may be removed, but leaving them is advantageous in terms of the wear resistance.

It should be understood that any insulating material that can be micro-fabricated may be used for the wall-like members 12,15. In addition, a photoresist may be used instead of polyimide, and any conductive material may be used for the electrodes 13a, 13b, 16a, 16b and 14. Moreover, aluminum, spin-on glass, or other suitable materials may be used for the mask portions 25,26 rather than nickel.

Figure 3:
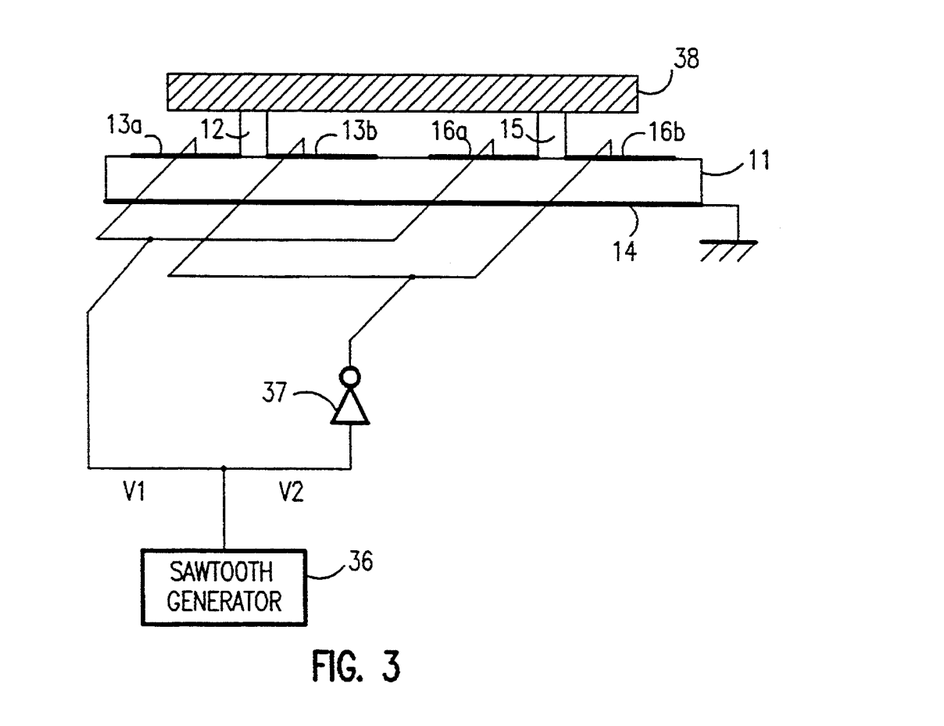
FIG. 3 is a diagram showing the electrical connections of the micro-actuator of FIG. 1.

As shown in FIG. 3, the aluminum electrodes 13a, 16a are electrically connected to an output terminal of a sawtooth generator 36, and supplied with a voltage pattern V1 having a sawtooth waveform. The aluminum electrodes 13b, 16b are electrically connected to the same output terminal of the sawtooth generator 36 via an inverter 37, and supplied with a voltage pattern V2 having an opposite polarity to that of the voltage pattern V1. The aluminum film 14 is grounded. An object 38 is supported by the wall-like members 12,15.

Figure 4A:
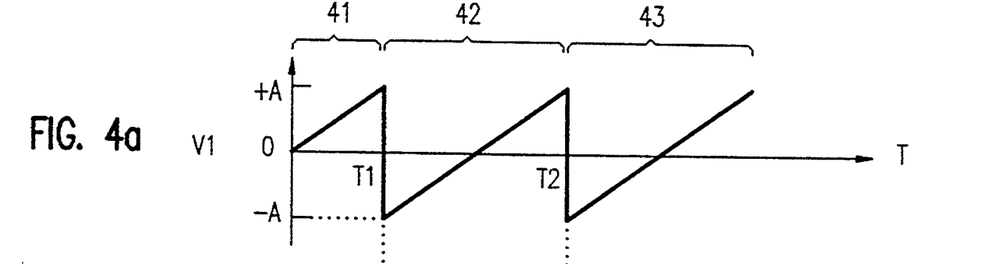
FIGS. 4(a) and 4(b) are waveform diagrams showing an example of first and second voltage patterns, respectively, applied to the electrode pairs according to the present invention.
Figure 4B:
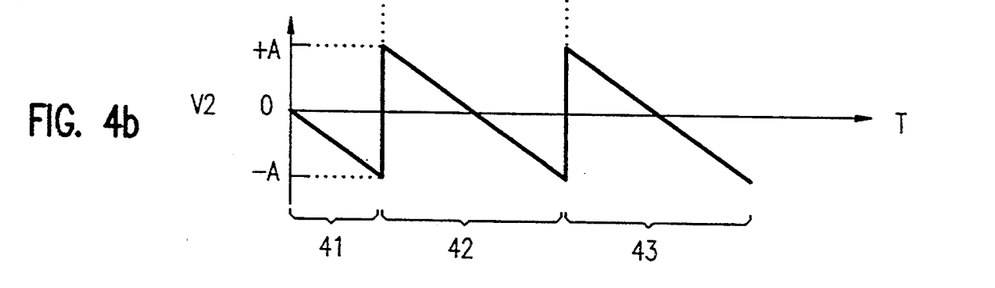

As shown in FIG. 4, the voltage pattern V1 43 to be applied to the electrodes 13a, 16a is an iteration of a gradual increase from −A volts to +A volts and a rapid decrease from +A volts to −A volts. On the other hand, the voltage pattern V2 44 to be applied to the electrodes 13b, 16b is an iteration of a gradual decrease from +A volts to −A volts and a rapid increase from −A volts to +A volts. For example, the repetition period of V1 and V2 is set at 1/50 second, and the value of A can be selected from a range of about 20 to about 30 volts.

Figure 5A:
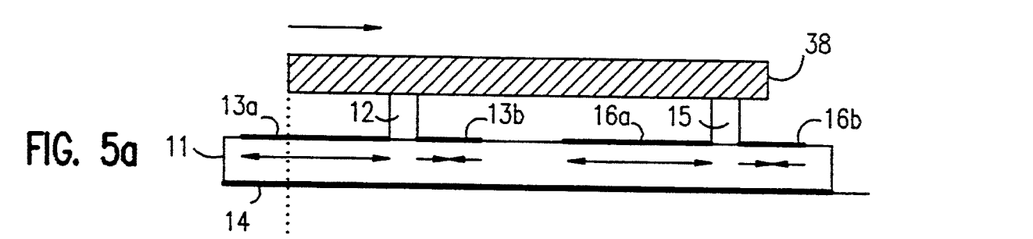
FIGS. 5(a) through 5(c) are side views of a pair of micro-actuators, illustrating the actuation principle of the present invention.
Figure 5B:
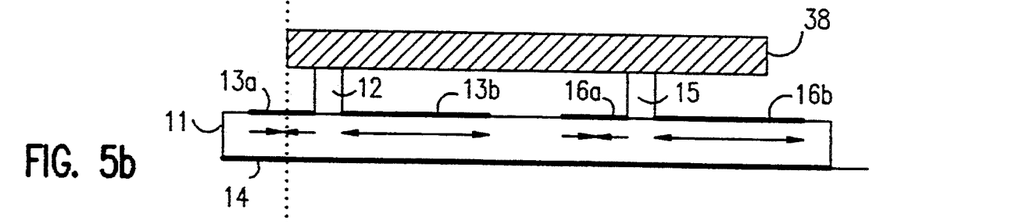
Figure 5C:
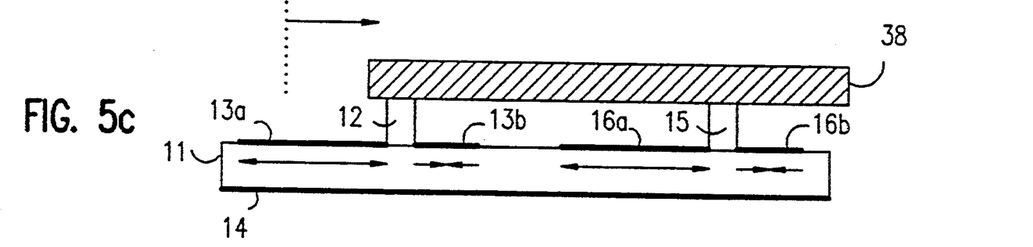

The driving principle of the actuator is described below with reference to a single micro-actuator and FIGS. 4 and 5, although the principle is the same for each micro-actuator in the array.

During the period 0 to t1 41 in FIG. 4(a), a downward electric field is generated between the electrode pair (13a, 14). An upward electric field is simultaneously generated between the electrode pair (13b, 14), as shown in FIG. 4(b). The strength of both electric fields gradually increases with time during this interval. Consequently, the PZT film 1 sandwiched by the electrode pair (13a, 14) slowly expands, and the PZT film 1 sandwiched by the electrode pair (13b, 14) slowly contracts. As a result, the wall-like member 12 moves to the right. By the same principle, member 15 also moves to the right. Since the wall-like members move slowly, rightward static friction is exerted on object 38. In response, object 38 slowly moves rightward following the movement of the wall-like members 12,15. FIG. 5(a) shows the operation of the micro-actuator immediately before time t1.

Referring back to FIGS. 4(a) and 4(b), the electric fields between the electrode pair (13a, 14) and between the electrode pair (13b, 14) at time t1 are reversed. The PZT film 11 sandwiched by the electrode pair (13a, 14) rapidly contracts and the PZT film 11 sandwiched by the electrode pair (13b, 14) rapidly expands. As a result, the wall-like member 12 rapidly moves leftward. Again, member 15 moves to the left by the same principle. In this case, object 38 cannot follow the movement of the wall-like members 12,15 because of its inertia and remains essentially stationary. This is true even though leftward dynamic friction is exerted on the object 38, since its magnitude is smaller than the maximum static friction and its duration is short.

During the period t1 to t2 in FIGS. 4(a) and 4(b), the electric field between the electrode pair (13a, 14) is initially upward and gradually becomes weaker; it then turns downward and gradually becomes stronger in the second half. On the other hand, the electric field between the electrode pair (13b, 14) is downward and becomes weaker in the first half, then turns upward and becomes stronger in the second half. Consequently, the PZT film 11 interposed between the electrode pair (13a, 14) is at first caused to contract, and the strain gradually decreases. After the strain has been eliminated entirely, the PZT film 11 starts to expand, and the strain increases gradually. The deformation pattern of the PZT film 11 interposed between the electrode pair (13b, 14) is opposite to the above pattern. That is, the PZT film 11 is first caused to expand, and the pattern then reverses, changing to contraction. As a result, during the period t1 to t2 42, the wall-like members 12,15 slowly move rightward, and the object 38 moves slowly rightward, following the movement of the wall-like members 12,15. FIG. 5(c) shows the position of the micro-actuator immediately before time t2.

At time t2, the micro-actuator operates in the same manner as at time t1. Therefore, while the wall-like members 12,15 move leftward, the object 38 remains stationary.

After time t2 43, the PZT film 11 repeats its slow and rapid deformations to give a rightward velocity to object 38. A speed of 1 μm/sec was obtained in an experiment using a 0.5-mm-thick, 5×5-mm² square silicon wafer as the object 38. It should be noted that during the series of steps of deforming the PZT film 11, the aluminum films 13a and 13b contract in accordance with the contraction of the PZT film 11.

Figure 6A:
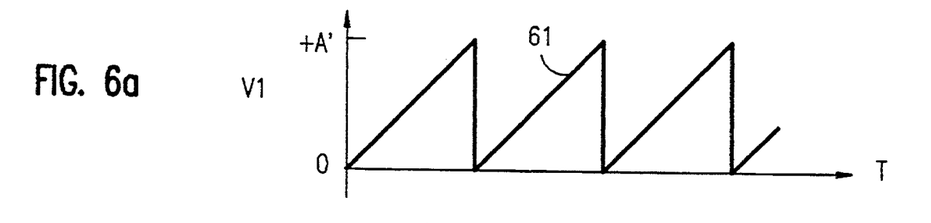
FIGS. 6(a) and 6(b) are waveform diagrams showing alternative first and second voltage patterns according to the present invention.
Figure 6B:
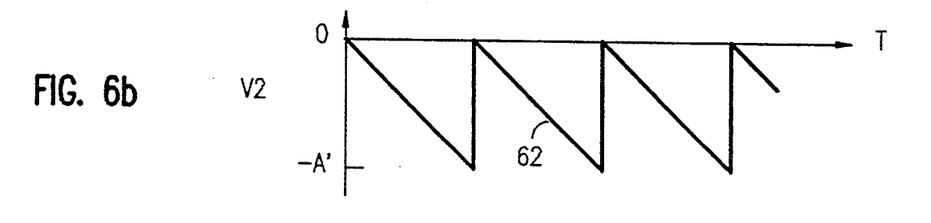
Figure 7A:
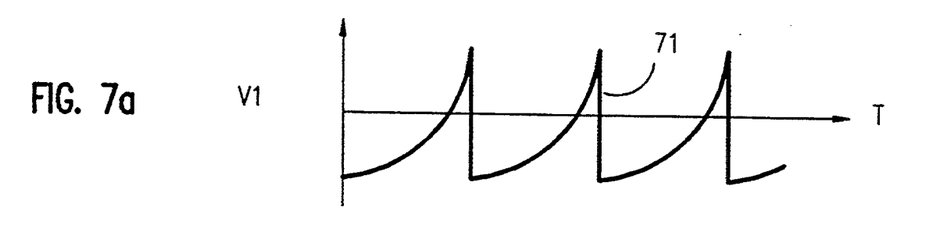
FIGS. 7(a) and 7(b) are waveform diagrams showing another alternative of the first and second voltage patterns according to the present invention.
Figure 7B:
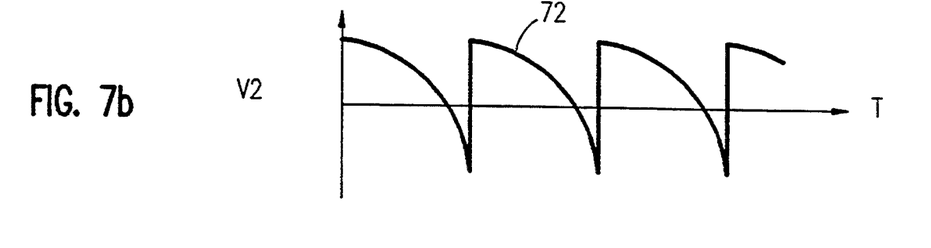

As shown in FIG. 6, the voltage to be applied to the electrode 13a may be varied between 0 volts and +A' volts, and the voltage to be applied to the electrode 13b may be varied between 0 volts and −A' volts. However, the voltage patterns of FIGS. 4(a) and 4(b) are the best for moving object 38 rapidly while keeping the absolute values of the voltages across the electrode pairs within a range in which the polarization of the PZT film 11 is not changed.

It will be understood that the voltage patterns to be applied to the electrodes 13a and 13b may have waveforms other than those shown in FIGS. 4 and 6. That is, semi-sawtooth waveforms like those shown in FIG. 7 may be used. The waveforms of FIG. 7, which are quadratic, can exert a force that is maximal (with maximum static friction) and constant on the object 38 when moving it rightward. However, the waveforms of FIGS. 4 and 6 are preferable, because they can be generated by simpler circuits.

In order to move the wall-like members 12,15 rapidly leftward for the purpose of sliding the object 38, it is required that the wall-like members 12,15 move with as large an acceleration as possible and complete their movement in a short period of time. This may be achieved, for example, by changing the polarities of the voltages instantaneously, as in FIGS. 4, 6, and 7.

Although the foregoing explanation describes how to move the object 38 rightward, it will be understood that the object can be moved leftward by applying the voltage pattern V2 to the electrode 13a and the voltage pattern V1 to the electrode 13b. The direction of movement of the object 38 can thus be changed easily.

Figure 8:
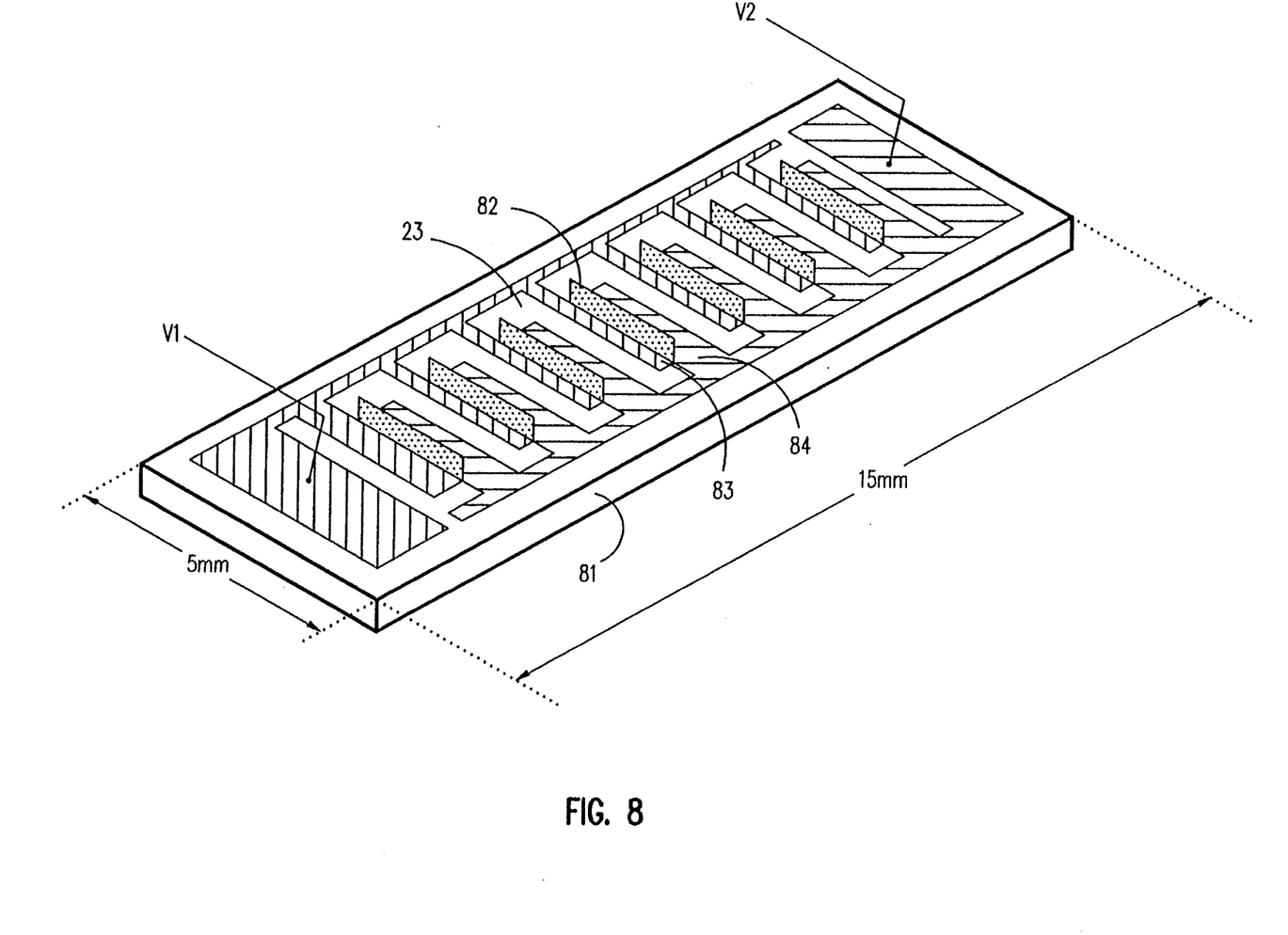
FIG. 8 is a perspective view showing an example of a one-dimensional-array-type micro-actuator device according to the present invention.

FIG. 8 shows an array-type micro-actuator device in which the micro-actuators of FIG. 1 are arranged on the PZT film 81 in a one-dimensional array. The aluminum electrodes on the left side of each respective wall-like members, e.g., electrode 83 adjacent to member 81, are connected in parallel to a source (not shown) having the voltage pattern V1. The aluminum electrodes on the right side of the respective wall-like members, e.g., electrode 84 adjacent to member 81, are connected in parallel to a source (not shown) having the voltage pattern V2.

Figure 9:
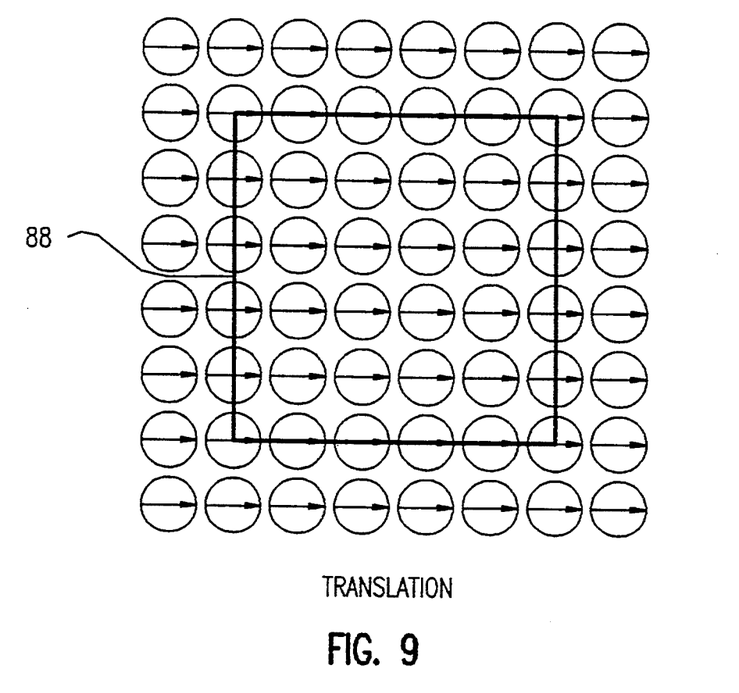
FIG. 9 illustrates the actuation principle of the translational movement of a two-dimensional-array-type micro-actuator device according to the present invention.
Figure 10:
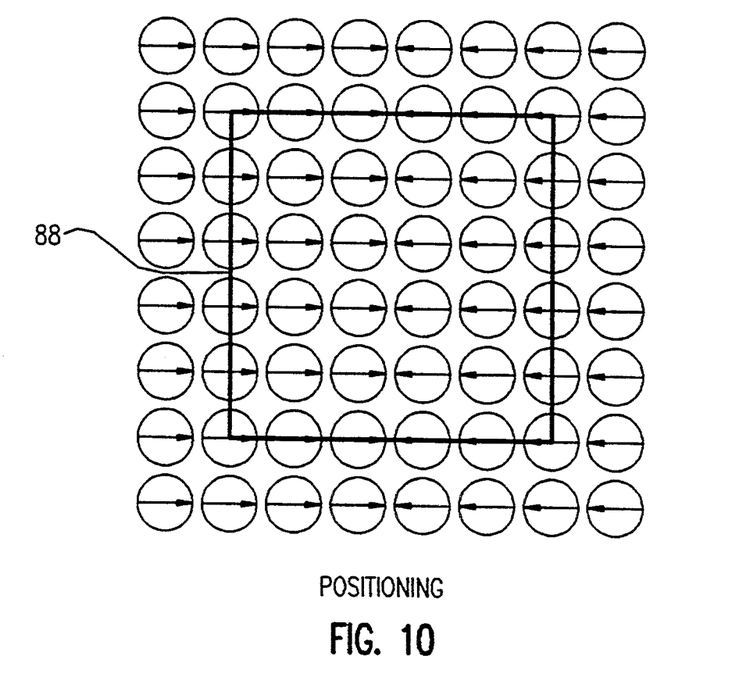
FIG. 10 illustrates the actuation principle of positioning of a two-dimensional-array-type micro-actuator device according to the present invention.
Figure 11:
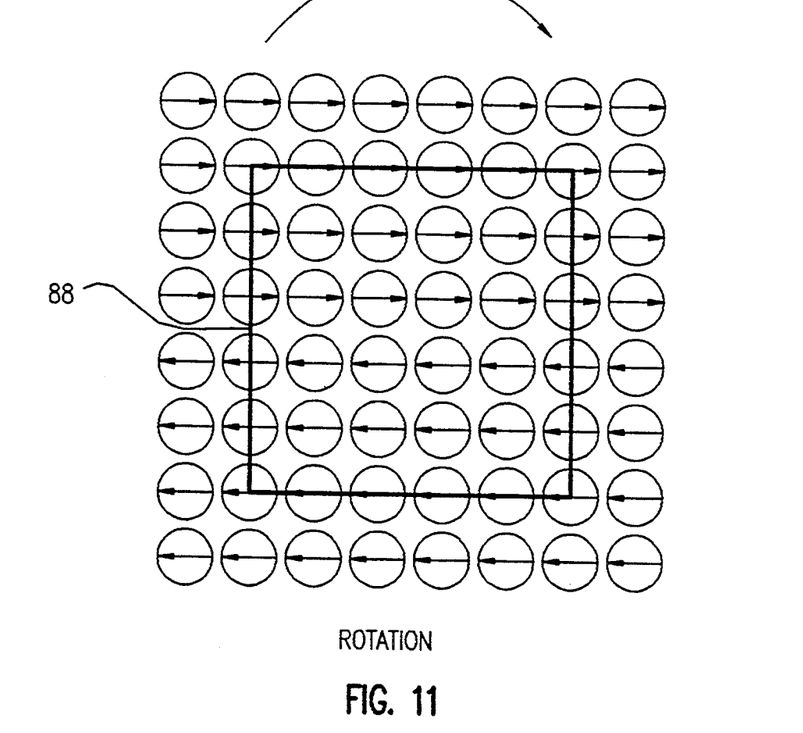
FIG. 11 illustrates the actuation principle of the rotational movement of a two-dimensional-array-type micro-actuator device according to the present invention.

FIGS. 9–11 show array-type micro-actuator devices in which the micro-actuators are arranged in a two-dimensional array. In the figures, a circle represents one micro-actuator, and an arrow represents the direction of its slow movement. Only the outline of an object 88 is represented by a solid line. A large number of micro-actuators can be manufactured at the same time, for example, by using a lithography technique.

As shown in FIG. 9, if all the micro-actuators have the same direction of slow movement, the object 88 is translated. As shown in FIG. 10, if the slow movement direction of the micro-actuators in the left half is rightward and that of the micro-actuators in the right half is leftward, the object 88 stops at their boundary. Thus, positioning of the object 88 is performed easily. This array-type micro-actuator device can be used as a fine positioning stage to align a recording head (object 88) and a slider. As shown in FIG. 11, if the slow movement of the actuators in the upper half is rightward and that of the actuators in the lower half is leftward, the object 88 rotates clockwise. Therefore, a micro-machine that combines this array-type micro-actuator device and the object 88 functions as a motor.

Figure 12:
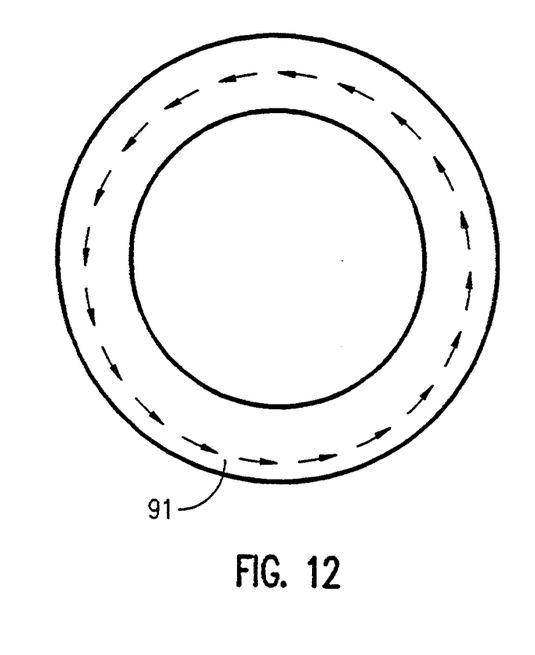
FIG. 12 illustrates the actuation principle of a micro-machine according to the present invention that functions as a motor.

FIG. 12 shows an alternative embodiment in which a large number of micro-actuators are formed on the surface of a ring-like PZT film 91. If the slow movements of the micro-actuators are controlled so that they are generally in the directions indicated by the arrows, and a rotor (not shown) is supported and driven by the actuators, a micro-machine functioning as a motor can be realized.

We claim:

1. A micro-actuator comprising:
    a piezoelectric film;
    a wall-like member formed on one surface of said piezoelectric film;
    first and second pairs of electrodes located one pair on each side of said wall-like member; and
    means for generating a first voltage pattern between said first pair of electrodes and a second voltage pattern between said second pair of electrodes, said first and second voltage patterns comprising essentially sawtooth waves and having opposite polarities.

2. The micro-actuator of claim 1, wherein said first voltage pattern is an iteration of a gradual increase from a predetermined negative value to a predetermined positive value and a rapid decrease from said positive value to said negative value, the absolute values of said positive and negative values being equal, and wherein said second voltage pattern is an iteration of a gradual decrease from said positive value to said negative value and a rapid increase from said negative value to said positive value.

3. The micro-actuator of claim 2, wherein said absolute value of said predetermined positive and negative values is in the range of 20 to 30 V, inclusive.

4. The micro-actuator of claim 2, wherein each of said first and second voltage pattern iterations has a period of about 1/50 s.

5. The micro-actuator of claim 1, wherein said piezoelectric film comprises PZT.

6. The micro-actuator of claim 1, wherein said wall-like member comprises polyimide.

7. The micro-actuator of claim 1, wherein said wall-like member comprises a photo-resist.

8. The micro-actuator of claim 1, wherein said first and second pairs of electrodes are made of metal films, and the electrodes of each electrode pair which are disposed furthest from said wall-like member are connected to each other and grounded.

9. A device with a micro-actuator array comprising:
    a piezoelectric film having first and second opposite surfaces;
    a plurality of wall-like members arranged in an array on said first surface; and means for generating a first voltage pattern between said first and second surfaces on one side of each wall-like member, and a second voltage pattern between said first and second surfaces on the other side of each wall-like member, said first and second voltage patterns comprising essentially sawtooth waves and having opposite polarities.

10. The micro-actuator of claim 9, wherein said first voltage pattern is an iteration of a gradual increase from a predetermined negative value to a predetermined positive value and a rapid decrease from said positive value to said negative value, the absolute values of said positive and negative values being equal, and wherein said second voltage pattern is an iteration of a gradual decrease from said positive value to said negative value and a rapid increase from said negative value to said positive value.

11. The micro-actuator of claim 10, wherein said absolute value of said predetermined positive and negative values is in the range of 20 to 30 V, inclusive.

12. The micro-actuator of claim 10, wherein each of said first and second voltage pattern iterations has a period of about 1/50 s.

13. The device of claim 9, wherein said piezoelectric film comprises PZT.

14. The device of claim 9, wherein said wall-like members comprise polyimide.

15. The device of claim 9, wherein said wall-like members comprise photo-resists.

16. The device of claim 9, wherein said means for generating said first and second voltage patterns comprises a plurality of electrode pairs, each wall-like member having a first electrode pair disposed on a first side and a second electrode pair disposed on the opposite side.

17. The device of claim 16, wherein each of said plurality of electrode pairs comprises metal film, and the electrodes of each electrode pair which are disposed furthest from each of said wall-like members are connected to each other and grounded.

18. A micro-machine comprising:
a piezoelectric film;
a plurality of wall-like members arranged in an array on one surface of said piezoelectric film; and
an object supported by said wall-like members;
wherein the pattern of expansion and contraction of said piezoelectric film is controlled spatially and temporally by generating an electric field pattern normal to said piezoelectric film to produce an iterated pattern, wherein said piezoelectric film is first slowly contracted on a first side of each of said wall-like members and slowly expanded on the second side thereof, causing each said wall-like member to move slowly in said first direction, and then said piezoelectric film is rapidly expanded on said first side and rapidly contracted on said second side, causing each said wall-like member to move rapidly in said second direction, thus causing said object to move in said first direction.

19. The micro-machine of claim 18, wherein said object is positioned by moving some of said wall-like members in a direction different from that of the others during said slow movement.

20. The micro-machine of claim 18, wherein said object is rotated by moving some of the wall-like members in a direction different from that of the others during said slow movement.

21. The micro-machine of claim 18, wherein said wall-like members are formed by a lithography technique.

22. In a device having a micro-actuator array comprising a piezoelectric film having first and second opposite surfaces and a plurality of wall-like members arranged in an array on said first surface, a driving method for moving an object supported by said wall-like members in a predetermined direction, comprising the following iterated steps:

generating a gradually changing voltage between said first and second surfaces of said piezoelectric film on each side of every wall-like member, wherein said array of wall-like members are moved slowly in said predetermined direction by causing said piezoelectric film to contract slowly on one side of every wall-like member, and simultaneously causing said piezoelectric film to expand slowly on the other side of every wall-like member; and generating a rapidly changing voltage between said first and second surfaces of said piezoelectric film on each side of every wall-like member, wherein every wall-like member is moved rapidly in the direction opposite to said predetermined direction by causing said piezoelectric film to expand rapidly on said one side of every wall-like member and, at the same time, causing said piezoelectric film to contract rapidly on the other side of every wall-like member.

* * * * *